US012774516B2

(12) United States Patent
Cha

(10) Patent No.: US 12,774,516 B2
(45) Date of Patent: Oct. 27, 2026

(54) ELECTROMAGNETIC WAVE SHIELDING MATERIAL AND METHOD OF PREPARING THE SAME

(71) Applicant: Hyundai Kefico Corporation, Gunpo (KR)

(72) Inventor: Sung Chul Cha, Seoul (KR)

(73) Assignee: Hyundai Kefico Corporation, Gunpo (KR)

( * ) Notice: Subject to any disclaimer, the term of this patent is extended or adjusted under 35 U.S.C. 154(b) by 0 days.

(21) Appl. No.: 18/860,061

(22) PCT Filed: Apr. 26, 2023

(86) PCT No.: PCT/KR2023/005715
§ 371 (c)(1),
(2) Date: Oct. 25, 2024

(87) PCT Pub. No.: WO2023/211160
PCT Pub. Date: Nov. 2, 2023

(65) Prior Publication Data
US 2025/0290189 A1 Sep. 18, 2025

(30) Foreign Application Priority Data
Apr. 28, 2022 (KR) ........................ 10-2022-0052888

(51) Int. Cl.
*C23C 14/14* (2006.01)

(52) U.S. Cl.
CPC .................................... *C23C 14/14* (2013.01)

(58) Field of Classification Search
CPC ..... C23C 14/14; C23C 14/185; C23C 14/205; H05K 9/0084
USPC ................... 204/192.15; 428/692.1; 361/816
See application file for complete search history.

(56) References Cited

U.S. PATENT DOCUMENTS 4,079,169 A * 3/1978 Nigh ..................... C23C 14/028
428/928
9,836,095 B1 * 12/2017 Lim ........................ H01L 24/33
2015/0030878 A1 * 1/2015 Zhi ...................... H05K 9/0088
428/323

FOREIGN PATENT DOCUMENTS

JP 2014-214335 A 11/2014
JP 2020-004940 A 1/2020
JP 2020-092279 A 6/2020
KR 10-2014-0142708 A 12/2014
KR 10-2020-0089113 A 7/2020

OTHER PUBLICATIONS

Lim, et al., "Effects of Composition on the Electromagnetic Wave Shielding/Absorption and Corrosion in Zn—Ni Alloy Thin Film", 2022, Korean J. Met. Mater., vol. 60, No. 1, pp. 62-67 (Year: 2022).*

* cited by examiner

*Primary Examiner* — Patrick S Ott
(74) *Attorney, Agent, or Firm* — Fox Rothschild LLP

(57) ABSTRACT

Disclosed are an electromagnetic wave shielding material, and a method of preparing the same, which includes a base material, and a Zn—NiCr shielding layer coated on a surface of the base material, thereby blocking electromagnetic waves coming from the outside to prevent malfunction of electronic components, and blocking electromagnetic waves generated in electronic components and radiating to the outside to minimize harmfulness to a human body.

7 Claims, 2 Drawing Sheets

[FIG. 1]
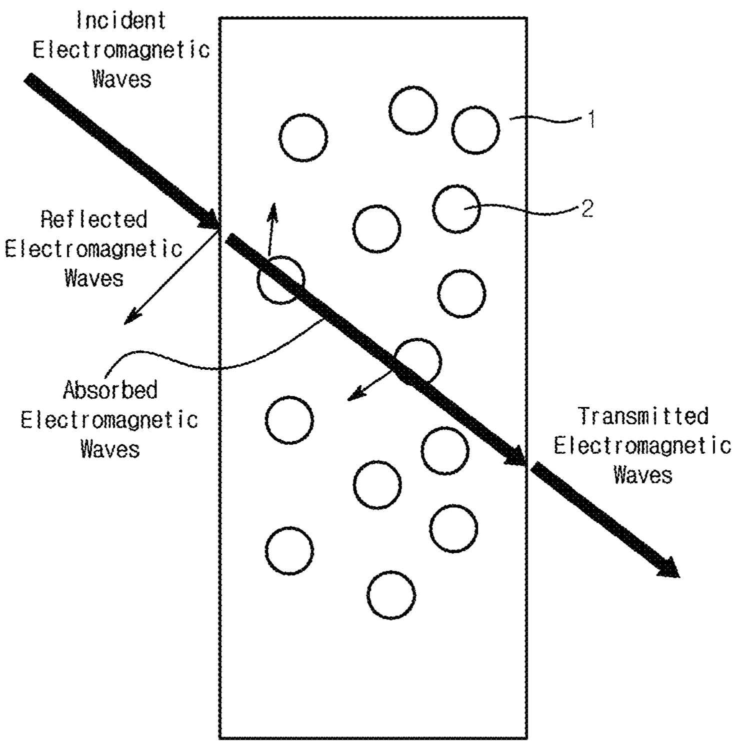
[FIG. 2]

[FIG. 3]
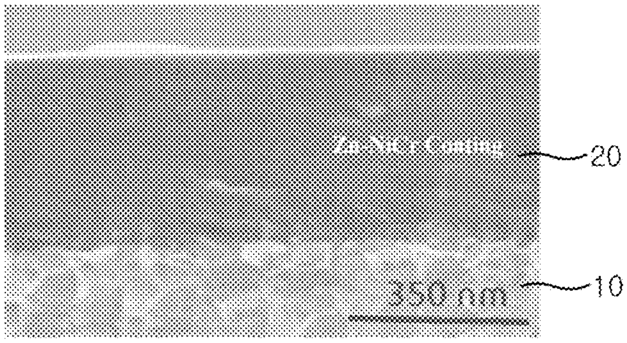
[FIG. 4]
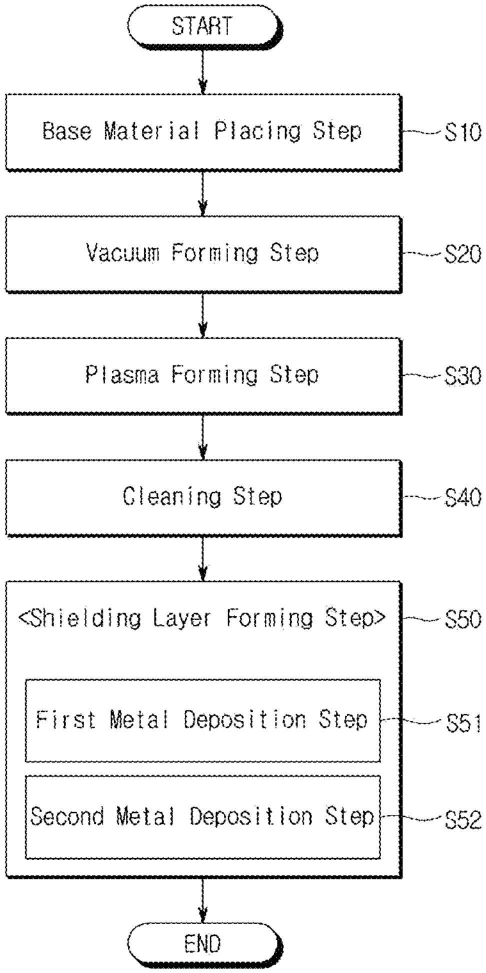

ELECTROMAGNETIC WAVE SHIELDING MATERIAL AND METHOD OF PREPARING THE SAME

CROSS REFERENCE TO RELATED APPLICATION(S)

The present application is a U.S. National Phase Application, pursuant to 35 U.S.C. $371 of PCT Application No. PCT/KR2023/005715, filed Apr. 26, 2023 which claims the benefit of Korean Application No. 10-2022-0052888 filed Apr. 28, 2022, which are incorporated by referenced herein in their entirety.

TECHNICAL FIELD

The disclosure relates to an electromagnetic wave shielding material and a method of preparing the same, and more particularly to an electromagnetic wave shielding material, which blocks electromagnetic waves generated inside and outside a vehicle to prevent abnormal operations of electronic components for the vehicle, and a method of preparing the same.

BACKGROUND ART

Electromagnetic wave shielding refers to preventing noise generated inside electronic components from radiating to the outside, or blocking electromagnetic wave noise coming from sunlight or electronic devices of passersby.

In particular, the electronic components susceptible to external electromagnetic waves need to be shielded from the electromagnetic waves to prevent a malfunction, and thus various electromagnetic wave shielding technologies have been developed.

Further, the number of electronic components installed inside the vehicle is increasing as automobile industry becomes more advanced, but the electromagnetic wave shielding technologies for preventing these electronic components from the malfunction, which may lead to negligent accidents for a driver and passersby, have not been sufficiently researched and developed yet.

Such electronic components include a housing for a vehicle controller or vehicle motor, an air control valve (ACV) for a hydrogen vehicle, etc.

Currently, domestic and foreign vehicle manufacturers have developed technologies for blocking the electromagnetic waves generated inside and outside the vehicle by adding metal wires such as iron or aluminum wire, carbon-based materials such as carbon nanotubes or pitch, etc. into the housing so as to block electromagnetic waves, but these technologies have disadvantages that the overall weight of the housing is increased and anticorrosive treatment or the like processing is required.

Further, when a composite material capable of blocking the electromagnetic waves is prepared by dispersing a conductive filler material in a polymer matrix, it is difficult to uniformly disperse the filler material in the polymer matrix. In addition, processing of the composite material becomes more complicated because the filler material increases the strength of the composite material.

DISCLOSURE

Technical Problem

The disclosure is conceived to solve the foregoing problems that a conventional electromagnetic wave shielding material is heavy and difficult to prepare, and an aspect of the disclosure is to provide an electromagnetic wave shielding material, which is lightweight and excellent in compatibility with other materials, and a method of preparing the same.

Technical Solution

According to an embodiment of the disclosure, an electromagnetic wave shielding material includes: a base material; and a shielding layer coated on a surface of the base material, wherein the shielding layer contains at least one selected from a group consisting of zinc (Zn), nickel (Ni), and chromium (Cr).

The shielding layer may contain 53 atomic percent (at. %) or more and 63 at. % or less of zinc relative to a total number of atoms.

The shielding layer may contain 37 at. % or more and 47 at. % or less of nickel and chromium relative to a total number of atoms, and an atomic ratio of nickel and chromium is 1:1.

The shielding layer may be formed to have a thickness of 0.1 μm or more and 5 μm or less.

The shielding layer may exhibit an electromagnetic wave shielding performance of 40 dB/μm or more and 55 dB/μm or less at an electromagnetic frequency of 0.5 GHz.

According to an embodiment, a method of forming a shielding layer for blocking electromagnetic waves on a surface of a base material includes: a base material placing step of placing the base material inside a reaction chamber; and a shielding layer forming step of forming a shielding layer on an outer circumferential surface of the base material.

The shielding layer forming step may include: a first metal deposition step of sputtering a material from a first target containing zinc toward the base material; and a second metal deposition step of sputtering a material from a second target containing nickel and chromium toward the base material.

The second target may contain nickel and chromium at an atomic ratio of 1:1.

The shielding layer may contain 53 atomic percent at. % or more and 63 at. % or less of zinc relative to a total number of atoms.

The shielding layer may contain 37 at. % or more and 47 at. % or less of nickel and chromium relative to a total number of atoms, and an atomic ratio of nickel and chromium is 1:1.

In the first metal deposition step, power of 240 W or more and 250 W or less may be applied to the first target.

In the second metal deposition step, power of 160 W or more and 190 W or less may be applied to the second target.

Advantageous Effects

As described above, an electromagnetic wave shielding material according to the disclosure and the method of preparing the same have effects on blocking electromagnetic waves radiating from electronic components toward the outside and coming from the outside, reducing the overall weight, and being applicable to various materials.

DESCRIPTION OF DRAWINGS

FIG. 1 is a schematic diagram showing a conventional electromagnetic wave shielding material in which a conductive filler material is dispersed in a polymer matrix.

FIG. 2 is a schematic diagram showing a cross section of an electromagnetic wave shielding material according to a first embodiment of the disclosure.

FIG. 3 is a scanning electron microscope (SEM) image showing a cross section of the electromagnetic wave shielding material according to a first embodiment of the disclosure.

FIG. 4 is a flowchart to describe a method of preparing an electromagnetic wave shielding material according to a second embodiment of the disclosure.

MODE FOR INVENTION

Below, exemplary embodiments of the disclosure will be described in detail with reference to the accompanying drawings.

The disclosure may be modified in various ways and have various embodiments, and thus specific embodiments will be illustrated by way of example in the accompanying drawings and described in detail. It should be understood, however, that the drawings and descriptions are not intended to limit the disclosure to the specific embodiments, but cover all modifications, equivalents, and alternatives that fall within the spirit and scope of the disclosure.

Although the terms "first," "second," etc. may be used herein to describe various elements, such elements should not be construed as limited by these terms. These terms are only used to distinguish one element from another. For example, a first element may be termed a second element, and the second element may also be termed the first element, without departing from the scope of the disclosure.

The terms "and/or" may include combinations of a plurality of related described items or any of a plurality of related described items.

When an element is described as being "connected" or "coupled" to another element, it should be understood that the element may be directly connected or joined to another element but intervening elements may be present therebetween. However, when an element is described as being "directly connected" or "directly coupled" to another element, it should be understood that there are no intervening elements therebetween.

The terminology used herein is for the purpose of describing particular embodiments only and is not intended to limit the disclosure. As used herein, the singular forms are intended to include the plural forms as well, unless the context clearly indicates otherwise.

It will be further understood that the terms "include" and/or "have" when used herein specify the presence of stated features, numbers, steps, operations, elements, parts, and/or combinations thereof, but do not preclude the presence or addition of one or more other features, numbers, steps, operations, elements, parts, and/or combinations thereof.

Unless otherwise defined, all terms including technical and scientific terms used herein have the same meaning as commonly understood by a person of ordinary skill in the art to which the disclosure pertains. It will be further understood that terms defined in commonly used dictionaries should be interpreted as having a meaning consistent with their meaning in the context of the related art and will not be interpreted in an idealized or overly formal sense unless explicitly defined herein.

In addition, the following embodiments are provided to a person having ordinary knowledge in the art in order to describe the disclosure more completely, in which the shapes, size, etc. of elements shown in the accompanying drawings may be exaggerated for clarity.

FIG. 1 is a schematic diagram showing a state that a conductive filler material is dispersed in a polymer matrix in a conventional electromagnetic wave shielding material.

Referring to the conventional electromagnetic wave shielding material shown in FIG. 1, a polymer matrix 1 such as polyethylene (PE), polypropylene (PP), and polycarbonate (PC) is internally filled with a filler material 2 such as metal nanowire, carbon black, and carbon nanotube.

However, the conventional electromagnetic wave shielding material has problems: it is difficult to uniformly disperse the filler material 2 in the polymer matrix 1, and the filler material 2 added to the polymer matrix 1 decreases the processability of the polymer matrix 1.

FIG. 2 is a schematic diagram showing a cross section of an electromagnetic wave shielding material according to a first embodiment of the disclosure, and FIG. 3 is a scanning electron microscope (SEM) image showing a cross section of the electromagnetic wave shielding material according to a first embodiment of the disclosure.

Referring to FIG. 2, the electromagnetic wave shielding material according to an embodiment of the disclosure includes a base material 10, and a shielding layer 20 coated on the surface of the base material 10.

The shielding layer 20 contains at least one selected from a group consisting of zinc (Zn), nickel (Ni), and chromium (Cr). Most preferably, the shielding layer 20 may contain all of zinc, nickel and chromium (Zn—NiCr), which is lightweight and excellent in shielding properties.

Specifically, the shielding layer 20 is coated on one side of the base material 10 to prevent electromagnetic waves from entering the interior of the base material 10 from the outside or prevent electromagnetic waves from exiting the interior of the base material 10 to the outside, thereby providing an electromagnetic wave shielding material having a multi-layered structure.

The base material 10 shown in the first an embodiment has a flat surface, but is not limited thereto. Alternatively, the base material 10 may have various shapes such as curved surfaces corresponding to the shape of the electronic components for the vehicle.

The base material 10 may be made of, but not limited to, plastic such as polyethylene (PE), polypropylene (PP), and polycarbonate (PC); glass; ceramic such as alumina and zeolite; or a composite material thereof.

In this case, the shielding layer 20 may be formed by physical deposition, preferably by physical vapor deposition (PVD).

The PVD includes various methods such as arc ion plating (AIP), sputtering, pulsed laser deposition (PLD), etc. In this embodiment, magnetron sputtering is used, but not limited thereto. Alternatively, a conventionally known PVD may be used to form the shielding layer 20.

For example, zinc atoms, which are sputtered when a PVD apparatus based on the magnetron sputtering according to an embodiment of the disclosure applies a sputtering voltage to a zinc target, are deposited on the base material 10.

After the zinc atoms are deposited on the base material 10, nickel atoms and chromium atoms, which are sputtered when the PVD apparatus based on the magnetron sputtering applies a sputtering voltage to a nickel-chromium target, are deposited on the base material 10, thereby forming a Zn—NiCr shielding layer 20.

The nickel-chromium target contains nickel and chromium at an atomic ratio of 1:1.

The shielding layer 20 contains 53 atomic percent (at. %) or more and 63 at. % or less of zinc relative to the total number of atoms.

When the shielding layer 20 contains less than 53 at. % of zinc relative to the total number of atoms, malfunction of internal electronic components may be caused because the shielding performance of the shielding layer 20 is too low to sufficiently block the electromagnetic waves coming from the outside.

Further, when the shielding layer 20 contains more than 63 at. % of zinc relative to the total number of atoms, the shielding layer 20 is improved in the shielding performance but decreased in the corrosion resistance due to external factors, thereby causing a problem of reducing long-term shielding stability.

Further, the shielding layer 20 contains 37 at. % or more and 47 at. % or less of nickel and chromium relative to the total number of atoms, in which an atomic ratio of nickel and chromium is 1:1.

When the shielding layer 20 contains less than 37 at. % of nickel and chromium relative to the total number of atoms, corrosion potential is lowered to increase a tendency to corrode in external environments, thereby causing a long-term decrease in the electromagnetic wave shielding performance.

Further, when the shielding layer 20 contains more than 47 at. % of nickel and chromium relative to the total number of atoms, the corrosion potential is raised to improve the corrosion resistance, but the performance of shielding the electromagnetic waves coming from the outside is lowered.

The shielding layer 20 is formed to have a thickness of 0.1 μm or more and 5 μm or less, which is a range optimized to block the electromagnetic waves coming from the outside and maintain a lightweight characteristic.

When the thickness of the shielding layer 20 is less than 0.1 μm, the malfunction of the internal electronic components may be caused because the amount of attenuating the electromagnetic waves, which come from the outside or moving outward from the inside, is decreased.

Further, when the thickness of the shielding layer 20 is more than 5 μm, an additional effect of blocking the electromagnetic waves is marginal, a coating time taken in forming the shielding layer 20 is increased, a brittle columnar structure is formed to increase residual stress within a layer.

The shielding layer 20 exhibits an electromagnetic wave shielding performance of 40 dB/μm or more and 55 dB/μm or less at 0.5 GHz.

Based on the specific absorption rates (SAR) for the electromagnetic waves, stipulated by No. 2019-4 in Ministry of science and ICT, the general public should be exposed to the electromagnetic waves of 0.08 W/kg or less for the whole body, 1.6 W/kg or less for the head and torso, and 4 W/kg or less for the legs and arms, which were measured at an arbitrary value of 0.5 GHz within range of 100 kHz to 10 GHz.

When the shielding layer 20 exhibits a shielding performance of less than 40 dB/μm at 0.5 GHz, the malfunction of the electronic components present inside the electromagnetic wave shielding material may be caused, the electromagnetic waves generated in the electronic components are not sufficiently attenuated, thereby having an adverse effect on the health of the general public.

Further, when the shielding layer 20 exhibits a shielding performance of more than 55 dB/μm at 0.5 GHz, an additional effect of blocking the electromagnetic waves is marginal, and increase in the amount of materials used for the electromagnetic wave shielding material reduces economic feasibility.

Below, a method of preparing an electromagnetic wave shielding material according to a second embodiment of the disclosure will be described step by step with reference to FIG. 4.

Referring to FIG. 4, to form the shielding layer 20 on the surface of the base material 10, the method of preparing the electromagnetic wave shielding material according to the second embodiment of the disclosure includes a base material placing step S10 of placing the base material 10 inside a reaction chamber, and a shielding layer forming step S50 of forming the shielding layer 20 on an outer circumferential surface of the base material 10.

In the base material placing step S10, the base material 10 is placed inside the reaction chamber of the PVD apparatus based on the magnetron sputtering, in which a fixture (not shown) may be used to fix the base material 10.

Specifically, the base material 10 made of a metal material may be fixed by a magnetic fixture using an attractive force based on a magnetic field.

The shielding layer forming step S50 includes a first metal deposition step S51 of sputtering a material from a first target, which contains zinc, toward the base material 10, and a second metal deposition step S52 of sputtering a material from a second target, which contains nickel and chromium, toward the base material 10.

The second target contains nickel and chromium at an atomic ratio of 1:1.

The shielding layer 20 contains atoms 53 at. % or more and 63 at. % or less of zinc relative to the total number of atoms.

When the shielding layer 20 contains less than 53 at. % of zinc relative to the total number of atoms, malfunction of internal electronic components may be caused because the shielding performance of the shielding layer 20 is too low to sufficiently block the electromagnetic waves coming from the outside.

Further, when the shielding layer 20 contains more than 63 at. % of zinc relative to the total number of atoms, the shielding layer 20 is improved in the shielding performance but decreased in the corrosion resistance due to external factors, thereby causing a problem of reducing long-term shielding stability.

The shielding layer 20 contains 37 at. % or more and 47 at. % or less of nickel and chromium relative to the total number of atoms, in which an atomic ratio of nickel and chromium is 1:1

When the shielding layer 20 contains less than 37 at. % of nickel and chromium relative to the total number of atoms, corrosion potential is lowered to increase a tendency to corrode in external environments, thereby causing a long-term decrease in the electromagnetic wave shielding performance.

Further, when the shielding layer 20 contains more than 47 at. % of nickel and chromium relative to the total number of atoms, the corrosion potential is raised to improve the corrosion resistance, but the performance of shielding the electromagnetic waves coming from the outside is lowered.

In the first metal deposition step S51, power of 240 W or more and 250 W or less is applied to the first target.

When the power of less than 240 W is applied to the first target, the amount of zinc sputtered from the first target is decreased, and thus the blocked amount of the electromagnetic waves coming from the outside of the shielding layer 20 is decreased.

When the power of more than 250 W is applied to the first target, the amount of zinc sputtered from the first target is increased, and thus the blocking amount of the electromagnetic waves coming from the outside of the shielding layer 20 is decreased, and thus the shielding layer 20 is improved in the electromagnetic wave shielding performance but decreased in the corrosion resistance.

Further, in the second metal deposition step S52, power of 160 W or more and 190 W or less is applied to the second target.

When the power of less than 160 W is applied to the second target, the amount of nickel and chromium sputtered from the second target is decreased, and thus the shielding layer 20 is decreased in the corrosion resistance.

When the power of more than 190 W is applied to the second target, the amount of nickel and chromium sputtered from the second target is increased, and the shielding layer 20 is increased in the corrosion resistance, but the blocking amount of the electromagnetic waves coming from the outside is decreased.

Further, the method of preparing the electromagnetic wave shielding material according to the second embodiment of the disclosure additionally includes a vacuum forming step S20 of maintaining the internal atmosphere of the reaction chamber in a vacuum state while the base material 10 is placed inside the reaction chamber after the base material placing step S10, a plasma forming step S30 of forming a plasma state to generate argon (Ar) ions by injecting Ar gas into the reaction chamber and raising the temperature of the reaction chamber, and a cleaning step S40 of cleaning the surface of the base material 10 by striking the surface of the base material 10 with the Ar ions.

In the vacuum forming step S20, the fixture on which the base material 10 is mounted is placed inside the reaction chamber, and the internal atmosphere of the reaction chamber is vacuumized and kept vacuum.

Next, in the plasma forming step S30, the Ar gas is supplied as a process gas, and a thermostat is used to raise the temperature, thereby forming the plasma state with Ar ions inside the reaction chamber.

Then, in the cleaning step S40, a bias voltage is applied to a bias electrode so that the Ar ions can be accelerated to collide with the surface of the base material 10, thereby cleaning the surface of the base material 10.

This is to enhance adhesion between the electromagnetic wave shielding layer 20 and the base material 10 by preferentially performing an etching process to remove an oxide layer and impurities naturally formed on the surface of the base material 10.

In this case, the bias voltage may be maintained in a range of 200 V or higher and 400 V or lower. When the bias voltage is lower than 200 V, the voltage for accelerating the Ar ions is lowered to decrease the hardness of the shielding material. When the bias voltage is higher than 400 V, the adhesion of the shielding material may be deteriorated due to irregular lattice arrangement.

Below, the results of evaluating and comparing the physical properties between embodiments, to which the method of preparing the electromagnetic wave shielding material according to the disclosure is applied, will be described.

EMBODIMENTS

First, the base material 10 shaped like a flat plate was placed inside the reaction chamber of the sputtering apparatus, the Ar gas became the plasma state while the interior of the reaction chamber is kept vacuum, the interior of the chamber was heated up to 80° C. so that the surface of the base material made of SUS440C stainless steel can be activated, and the bias voltage of 300 V was applied to strike and clean the surface of the base material 10 with the Ar ions.

After cleaning the surface of the base material 10, the first metal deposition step S51 of sputtering metal atoms including zinc toward the base material 10 was performed by applying predetermined power to the first target that contains zinc through the magnetron sputtering.

After performing the first metal deposition step S51, the second metal deposition step S52 of sputtering metal atoms including nickel and chromium toward the base material 10 was performed by applying power to the second target that contains nickel and chromium (where, an atomic ratio of nickel and chromium is 1:1) through the magnetron sputtering, thereby preparing the materials according to first to seventh embodiments.

The power applied to form and accelerate plasma toward the first target and the second target, and composition ratios (Zn—NiCr) for the shielding layer 20 are as shown in the following Table 1.

TABLE 1

| | Applied power (W) | | Atomic ratios |
|---|---|---|---|
| Embodiments | First target | Second target | Zn-NiCr |
| First embodiment | 250 | 200 | 52:48 |
| Second embodiment | 240 | 190 | 53:47 |
| Third embodiment | 250 | 210 | 56:44 |
| Fourth embodiment | 240 | 240 | 59:41 |
| Fifth embodiment | 250 | 170 | 61:39 |
| Sixth embodiment | 240 | 160 | 63:37 |
| Seventh embodiment | 250 | 160 | 64:36 |

Evaluation of Shielding Performance

First, a four-point probe was used to measure and evaluate the sheet resistance of the shielding layer 20.

In general, the sheet resistance is obtained by measuring the current flowing in a sample after applying a certain voltage to the sample. The sheet resistance is proportional to the applied voltage (V) and the length (L) of the sample, and inversely proportional to the current (I) flowing in the sample and the width (W) of the sample. Such a measurement method has been publicly known, and thus detailed descriptions thereof will be omitted.

To evaluate the shielding performance of the shielding layer, the shielding layers 20 according to the first to seventh embodiments were compared in the shielding performance at 0.5 GHz, based on the vehicle narrowband radiation international standards, CISPR 25 stipulated by the international special committee on radio interference (CISPR)

Evaluation of Corrosion Resistance

To evaluate the corrosion resistance of the shielding layer 20, a constant potential/constant current apparatus (e.g., AMETEK PARSTAT 4000A) was used to evaluate the corrosion potential and the corrosion current density.

Specifically, an AgCl/KCl electrode was used as a reference electrode, and a Pt electrode was used as a counter electrode. The measurement was performed in a range of −0.8 V to 0.4 V at a scan rate of 1 mV/s in a 3.5 wt. % sodium chloride solution.

TABLE 2

| Embodiments | Shielding performance (with thickness of 350 nm): Specific resistance (Ω/sq.) | Shielding performance (with thickness of 350 nm): Shielding effect (dB) | Evaluation of corrosion resistance: Corrosion potential $E_{corr}$ (V vs Ag/AgCl) | Evaluation of corrosion resistance: Corrosion current density $I_{corr}$ (V vs Ag/AgCl) |
|---|---|---|---|---|
| First embodiment | 2.7 | 37 | −0.383 | 0.59 |
| Second embodiment | 1.6 | 42 | −0.395 | 0.63 |
| Third embodiment | 1.1 | 46 | −0.408 | 4.77 |
| Fourth embodiment | 0.8 | 49 | −0.412 | 9.52 |
| Fifth embodiment | 0.7 | 50 | −0.437 | 11.31 |
| Sixth embodiment | 0.65 | 51 | −0.472 | 14.28 |
| Seventh embodiment | 0.6 | 52 | −0.481 | 14.93 |

As shown in the foregoing Table 2, as result of evaluating the shielding performance, the specific resistance was decreased from 2.7 Ω/sq. (first embodiment) to 0.6 Ω/sq. (seventh embodiment) and the shielding performance was increased from 37 dB (first embodiment) to 52 dB (seventh embodiment) as a ratio of zinc to the shielding layer 20 was increased.

Further, as results of evaluating the corrosion resistance, the corrosion potential compared to the reference potential (Ag/AgCl) was decreased from −0.383 V (first embodiment) to −0.481 V (seventh embodiment), and the corrosion current density was increased from 0.59 μA (first embodiment) to 14.93 μA (seventh embodiment) as a ratio of zinc to the shielding layer 20 was increased.

Consequently, the shielding layer 20, which contains 53 at. % or more and 63 at. % or less of zinc, and 37 at. % or more and 47 at. % or less of nickel-chromium (where, a atomic ratio of nickel and chromium is 1:1), has sufficient shielding performance and improved corrosion resistance.

Although a few embodiments of the disclosure have been described, it will be understood that various modifications and changes can be made by a person having ordinary knowledge in the art without departing from the spirit and scope of the disclosure set forth in the appended claims.

Such simple modifications or changes fall within the scope of the disclosure, and the specific scope of the disclosure will become apparent in the appended claims.

The invention claimed is:

1. An electromagnetic wave shielding material comprising:

a base material; and a shielding layer coated on a surface of the base material, wherein the shielding layer contains zinc-nickel-chromium alloy (Zn—NiCr);

wherein the shielding layer is a continuous thin film;

wherein the shielding layer contains 53 atomic percent (at. %) or more and 63 at. % or less of zinc relative to a total number of atoms, wherein the shielding layer contains 37 at. % or more and 47 at. % or less of nickel and chromium relative to the total number of atoms, and an atomic ratio of nickel and chromium is 1:1, wherein the shielding layer exhibits an electromagnetic wave shielding performance of 42 dB/μm or more and 51 dB/am or less at 0.5 GHz;

wherein the shielding layer has a corrosion potential of −0.472 V or more and −0.395 V or less relative to an Ag/AgCl reference potential; and wherein the shielding layer has a corrosion current density of 0.63 LA or more and 14.28 μA or less.

2. The electromagnetic wave shielding material of claim 1, wherein the shielding layer is formed to have a thickness of 0.1 μm or more and 5 μm or less.

3. A method of forming the electromagnetic wave shielding material of claim 1, the method comprising:

a base material placing step of placing the base material inside a reaction chamber; and a shielding layer forming step of forming the shielding layer on an outer circumferential surface of the base material.

4. The method of claim 3, wherein the shielding layer forming step comprises:

a first metal deposition step of sputtering a material from a first target containing zinc toward the base material; and a second metal deposition step of sputtering a material from a second target containing nickel and chromium toward the base material.

5. The method of claim 4, wherein the second target contains nickel and chromium at an atomic ratio of 1:1.

6. The method of claim 4, wherein, in the first metal deposition step, power of 240 W or more and 250 W or less is applied to the first target.

7. The method of claim 4, wherein, in the second metal deposition step, power of 160 W or more and 190 W or less is applied to the second target.

* * * * *